United States Patent [19]
Fuchs

[11] Patent Number: 5,747,996
[45] Date of Patent: May 5, 1998

[54] DEVICE FOR DETERMINING THE SPATIAL POSITION OF A SENSOR ELEMENT WHICH IS DISPLACEMENT RELATIVE TO A REFERENCE ELEMENT

[75] Inventor: Manfred H. Fuchs, Hamburg, Germany

[73] Assignee: U.S. Philips Corporation, New York, N.Y.

[21] Appl. No.: 667,287

[22] Filed: Jun. 20, 1996

Related U.S. Application Data

[63] Continuation of Ser. No. 401,067, Mar. 8, 1995, abandoned.

[30] Foreign Application Priority Data

Mar. 9, 1994 [DE] Germany ............. 44 07 785.8

[51] Int. Cl.$^6$ ............. G01B 7/004; G01R 33/02; G06K 11/16; A61B 5/05
[52] U.S. Cl. ............. 324/207.17; 128/653.1; 324/207.26; 324/247; 345/158; 345/163
[58] Field of Search ............. 324/207.17, 207.18, 324/207.19, 207.26, 247; 178/18–20; 128/653.1; 345/158, 163; 342/463

[56] References Cited

U.S. PATENT DOCUMENTS

| | | | |
|---|---|---|---|
| 3,983,474 | 9/1976 | Kuipers | 324/207.26 |
| 4,396,885 | 8/1983 | Constant | 324/207.17 |
| 4,560,930 | 12/1985 | Kouno | 324/247 X |
| 4,688,037 | 8/1987 | Krieg | 324/247 X |
| 4,788,987 | 12/1988 | Nickel | 128/777 |
| 4,829,250 | 5/1989 | Rotier | 324/247 X |
| 4,845,503 | 7/1989 | Adam et al. | 342/448 |
| 5,168,222 | 12/1992 | Volsin et al. | 324/247 X |

FOREIGN PATENT DOCUMENTS

| | | |
|---|---|---|
| 3838605 | 5/1990 | Germany . |
| 2125168 | 2/1984 | United Kingdom . |
| 90/07762 | 7/1990 | WIPO . |
| 94/04938 | 3/1994 | WIPO . |

OTHER PUBLICATIONS

"Magnetometer Position Indicator for Multichannel Meg" Ahlfors et al, Advances in Biomagnetism, New York, NY, pp. 693–696.

*Primary Examiner*—Gerard R. Strecker
*Attorney, Agent, or Firm*—Michael E. Schmitt

[57] ABSTRACT

A device for determining the spatial position of a sensor element (3) which is spatially displaceable relative to a reference element (1), includes three coils (4, 5, 6) which are arranged in the sensor element (3), consist of at least one wire turn, and are wound about a common center (7), at least three coils (2) which are arranged in the reference element (1) in spatially remote positions and consist of at least one wire turn, a current generator (11) for exciting the sensor element coils (4, 5 6) or the reference element coils (2) by means of a presettable excitation alternating current, and a processing circuit (15) for the voltages induced in the reference element coils (2) or in the sensor element coils (4, 5, 6). The processing circuit includes an arithmetic circuit which calculates, on the basis of the induced voltages, the distance coordinates $x_m$, $y_m$ and $z_m$ of the center (7) of the sensor element coils (4, 5, 6) in a coordinate system associated with the reference element (1), as well as a feedback circuit (13) which controls the excitation currents in dependence on the amplitude of the induced voltages.

19 Claims, 2 Drawing Sheets

DEVICE FOR DETERMINING THE SPATIAL POSITION OF A SENSOR ELEMENT WHICH IS DISPLACEMENT RELATIVE TO A REFERENCE ELEMENT

This is a continuation of application Ser. No. 08/401,067, filed Mar. 8, 1995, now abandoned.

BACKGROUND OF THE INVENTION

1. Field of the Invention

The invention relates to a device for determining the spatial position of a sensor element which is spatially displaceable relative to a reference element.

2. Description of the Related Art

A device of this kind, intended for determining the relative position and orientation of a multichannel MEG magnetometer and the head of a patient to be examined, is known from "Advances in Biomagnetism 1989, New York", page 693–696. A set of The transmitter coils, being oriented orthogonally relative to one another and around a common center, are arranged on the head and separately powered. The magnetic field formed is measured by means of a 7-channel magnetometer. The position vector of the coil set arranged on the head is determined by the non-linear least-squares fitting method. On the basis of the magnetometer measurement values, the field distribution which corresponds to the relevant magnetometer measurement values is searched from among the feasible field distributions. Mathematically unambiguous coordinate values $x_m$, $y_m$, and $z_m$ can be assigned to the field distributions found for the individual transmitter coils.

It can be theoretically demonstrated that it suffices to measure the fields of the transmitter coils in only three different positions in order to obtain unambiguous space coordinates $x_m$, $y_m$, and $z_m$. The accuracy can be enhanced by evaluation of additional field values measured in further positions.

If the angle space position of the set of orthogonal coils is also to be determined, field values determined in at least five different locations are required. Redundancy of the measurement values again enhances the accuracy of the calculated coordinates.

The known device allows for a comparatively accurate and low-noise coordinate determination, because use is made of SQUID magnetometers with superconducting measuring coils.

For the determination of the spatial position of a so-called mouse for computers, DE-A 38 38 605 discloses a device which utilizes acoustic waves emitted by the mouse and detected at three points of a reference system for distance measurement. WO 90/07762 discloses a similar device which preferably utilizes optical waves instead of acoustic waves.

SUMMARY OF THE INVENTION

It is an object of the invention to provide a device of the kind set forth which is based on the principle of measurement of magnetic field distributions and which supplies sufficiently accurate and low-noise result data even in the absence of superconducting measuring coils.

This object is achieved by means of a device of the kind set forth which comprises three coils which are arranged in the sensor element, (hereinafter referred to as "space coils" because they are disposed in the measurement space or as "sensor element coils") consist of at least one wire turn and are wound about a common center, at least three coils which are arranged in the reference element (hereinafter referred to as "reference coils" or "reference element coils") in spatially remote positions and consist of at least one wire turn, a current generator for exciting the space coils or the reference coils by means of a presettable excitation alternating current, a processing circuit for the voltages induced in the reference coils or in the space coils, which processing circuit comprises an arithmetic circuit which calculates, on the basis of the induced voltages, the distance coordinates $x_m$, $y_m$ and $z_m$ of the center of the space coils in a coordinate system associated with the reference element, as well as a feedback circuit which controls the excitation currents in dependence on the amplitude of the induced voltages.

A device of this kind can be used notably for determining the spatial position of a mouse, notably for three-dimensional cursors in the case of CAD programs, three-dimensional writing of an object in a computer, localizing objects relative to a coordinate origin in general and particularly in the field of medical measurements.

The invention utilizes the principle of measurement described in "Advances in Biomagnetism". This known principle can also be reversed for the present invention by utilizing the space coils as measuring coils, in which case the magnetic fields generated by the individual coils of the reference system are detected.

The accuracy can be substantially enhanced by means of the feedback circuit which ensures that the space coils receive larger excitation currents when their distance from the reference element is increased. Amplifiers for the induced voltages can thus be optimally driven. The dynamic measuring range of an amplifier can be increased by approximately a factor of 1000.

In an attractive embodiment of the invention, the winding axes of the space coils extend in mutually perpendicular directions. The conditional equations are thus simplified, so that less arithmetic computation is required.

The measuring accuracy and the signal-to-noise ratio can be further enhanced by applying the induced voltages to the processing circuit via a frequency-sensitive and/or phase-sensitive amplifier which is coupled to the current generator.

It is necessary to measure the field distributions which are separately produced by each individual coil of the sensor element or the reference element. This can be realised by way of excitation currents of the same frequency which are applied to the individual coils in a temporal succession, notably by means of a multiplexer.

However, it is alternatively possible to operate each excitation coil with a current of associated, different frequency. These currents can then be applied simultaneously, because the corresponding induced measuring voltages can be unambiguously selected. The latter method is particularly fast and enables, in conjunction with fast measurement value detection and localization algorithms, on-line localization with a measurement and calculation time of less than one second.

BRIEF DESCRIPTION OF THE DRAWINGS

The invention will be described in detail hereinafter with reference to the drawing. Therein.

DETAILED DESCRIPTION OF THE PREFERRED EMBODIMENTS

Figure 1:
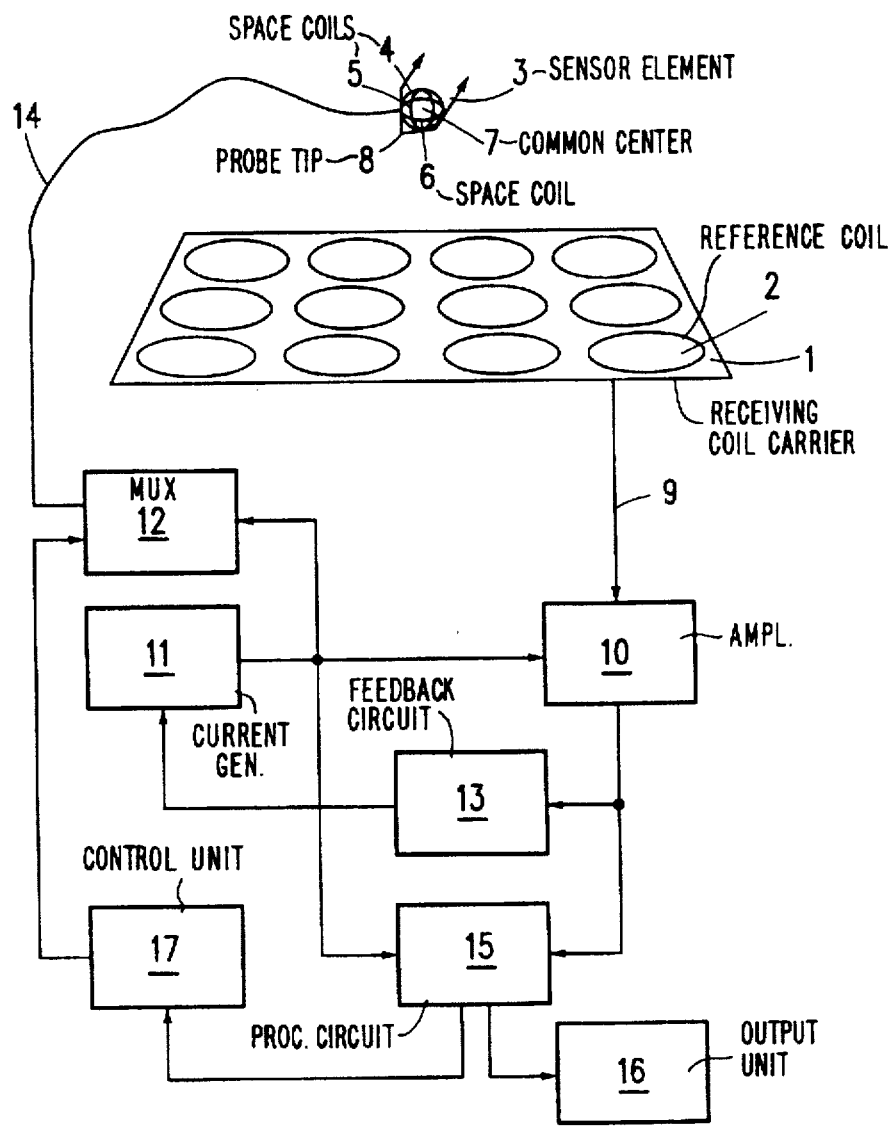
FIG. 1 shows the principle of an embodiment of the invention.

The reference 1 in FIG. 1 denotes a receiving coil carrier which serves as a reference element and which accommodates twelve reference coils 2 generally facing in the same direction. Reference coils 2 consist of several turns and serve, in the present example, as measuring coils in which alternating voltages to be measured are induced. The receiving coil carrier preferably forms a lower boundary plane of the space to be covered by the sensor element 3. The measuring coils 2 should be placed at an as large as possible distance from one another and extend as far as the outer edge of the boundary plane of the measurement space. The measuring coils, however, need not necessarily be arranged in a common plane.

The space coils 4, 5 and 6 serve as transmitter coils which produce a magnetic field distribution in the measurement space. They are wound in mutually perpendicular planes which extend through the common center 7.

The device shown in the Figure enables determination of the coordinates $x_m$, $y_m$ and $z_m$ of the center 7 in a coordinate system defined relative to the receiving coil carrier.

If the position of the probe tip 8 of the sensor element 3 must be known exactly, subsequent to the calculation of the coordinates $x_m$, $y_m$, and $z_m$ there can additionally be determined two angular coordinates in two orthogonal planes extending through the center 7. By evaluation of the sum of the squares of the measured magnetic field for each measuring coil the coordinates $x_m$, $y_m$ and $z_m$ can already be unambiguously determined from the data supplied by only three measuring coils. The functional dependencies on the angular coordinates are then eliminated. When the three-dimensional coordinates have been determined, a suitable arithmetic algorithm allows for additional determination, if desired, of the angular coordinates, because the condition that measurement values must be available from at least five different measurement positions is then satisfied. When twelve measuring coils are provided, as in the present case, the redundancy allows for a substantially higher accuracy.

The voltages induced in the measuring coils 2 are applied, via the conductor bundle 9, to the input of the frequency-sensitive and phase-sensitive amplifier 10 (lock-in amplifier). The range of phase and frequency selectivity of the amplifier 10 is predetermined by the frequency and the phase position of the signals generated by the current generator 11 which, via the multiplexer 12, excites the transmitter coils 4, 5 and 6 successively in time with preferably the same number of ampere turns.

Full use of the dynamic range of the amplifier 10 is enabled by the feedback circuit 13. When the distance between the sensor element 3 and the carrier 1 is increased, the current generator 11 is driven to increase the current applied to the transmitter coils 4, 5 and 6 via the bundle 14 to such an extent, that the amplifier is driven exactly to full output by the highest value of the voltages induced in the coils 2.

The processing circuit 15 receives information concerning the amplified, induced voltages of the coils 2, information concerning the instants of application of the currents to the transmitter coils 4, 5 and 6, as well as information concerning the intensity of the excitation current. On the basis of these data an arithmetic program, integrated in the processing circuit 15, calculates the spatial position of the sensor element by determination of the coordinates $x_m$, $y_m$ and $z_m$ as well as, if desired, of two angular coordinates for supply to the output unit 16. As soon as the control unit 17 receives the information that the calculation and output operation has been terminated, the multiplexer receives a control instruction to switch the excitation current to the next transmitter coil.

Figure 2:
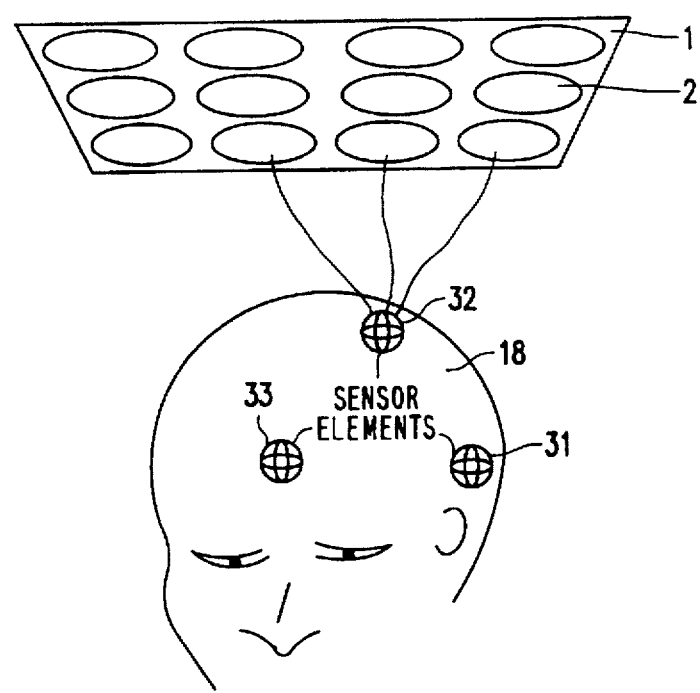
FIG. 2 shows a feasible application in medical technology.

FIG. 2 shows a feasible application of the invention in the field of medical technology.

Three sensor elements 31, 32 and 33, each consisting of three space coils, are fitted in different locations on the head 18 of a patient. The positions of the sensor elements 31, 32 and 33 can be separately determined by means of the receiving coil carrier 1 on which the reference coils are mounted.

Combining this device with a MEG magnetometer enables automatic determination of the position and the orientation of the MEG magnetometer.

What is claimed is:

1. A device for determining the spatial position of a sensor element which is spatially displaceable relative to a reference element, comprising:

three sensor element coils which are arranged in the sensor element, consist of at least one wire turn and are wound about a common center;

at least three reference element coils which are arranged in the reference element spaced apart from each other and consist of at least one wire turn, said reference element coils all facing in substantially the same direction;

a current generator for exciting the sensor element coils or the reference element coils by means of a presettable excitation alternating current;

a processing circuit for voltages induced in the reference element coils in response to the current generator exciting the sensor element coils or in the sensor element coils in response to the current generator exciting the reference element coils, which processing circuit comprises an arithmetic circuit that calculates, on the basis of the induced voltages, distance coordinates $x_m$, $y_m$, and $z_m$ of the center of the sensor element coils in a coordinate system associated with the reference element; and a feedback circuit which controls the excitation currents in dependence on the amplitude of the induced voltages.

2. A device as claimed in claim 1, wherein winding axes of the sensor element coils extend in mutually perpendicular directions.

3. A device as claimed in claim 1, wherein the induced voltages are applied to the processing circuit via a frequency-sensitive and/or phase-sensitive amplifier which is coupled to the current generator so as to receive a signal generated by the current generator that determines the range of phase and/or frequency selectivity of the amplifier.

4. A device as claimed in claim 1, wherein the current generator is connected, via a multiplexer, to the sensor element coils or to the reference element coils, and that the coils so-connected can be excited successively in time by currents of the same frequency.

5. A device as claimed in claim 1, wherein the sensor element coils or the reference element coils can be simultaneously driven by excitation alternating currents of different frequency.

6. A device as claimed in claim 1, wherein at least five reference element coils are arranged in the reference element, and the processing circuit is programmed so that the angular position of the sensor element can also be calculated.

7. A device as claimed in claim 6, wherein the processing circuit is programmed so that first the coordinates $x_m$, $y_m$ and $z_m$ are calculated, and subsequently two angular coordinates are calculated in mutually perpendicular planes which extend through the center of the sensor element coils.

8. A device as claimed in claim 2, wherein the induced voltages are applied to the processing circuit via a frequency-sensitive and/or phase-sensitive amplifier which is coupled to the current generator so as to receive a signal generated by the current generator that determines the range of phase and/or frequency selectivity of the amplifier.

9. A device as claimed in claim 2, wherein the current generator is connected, via a multiplexer, to the sensor element coils, acting as excitation coils, or to the reference element coils, and that the excitation coils can be excited successively in time by currents of the same frequency.

10. A device as claimed in claim 3, wherein the current generator is connected, via a multiplexer, to the sensor element coils, acting as excitation coils, or to the reference element coils, and that the excitation coils can be excited successively in time by currents of the same frequency.

11. A device as claimed in claim characterized in wherein the current generator is connected, via a multiplexer, to the sensor element coils, acting as excitation coils, or to the reference element coils, and that the excitation coils can be excited successively in time by currents of the same frequency.

12. A device as claimed in claim 11, wherein at least five reference element coils are arranged in the reference element, and the processing circuit is programmed so that the angular position of the sensor element can also be calculated.

13. A device as claimed in claim 4, wherein at least five reference element coils are arranged in the reference element, and the processing circuit is programmed so that the angular position of the sensor element can also be calculated.

14. A device as claimed in claim 5, wherein at least five reference element coils are arranged in the reference element, and the processing circuit is programmed so that the angular position of the sensor element can also be calculated.

15. A device as claimed in claim 1, wherein the reference element forms a boundary plane and the reference element coils are placed about said boundary plane at a maximumly large distance relative to each other.

16. A device as claimed in claim 15, wherein the reference element coils are placed in said boundary plane so as to be co-planar.

17. A device as claimed in claim 1, wherein the reference element forms a boundary plane and the reference element coils are placed in said boundary plane so as to be co-planar.

18. A device for determining the spatial position of a sensor element which is spatially displaceable relative to a reference element, the reference element forming a boundary plane, comprising:

three sensor element coils which are arranged in the sensor element, consist of at least one wire turn and are wound about a common center;

at least three reference element coils placed about the boundary plane at a maximumly large distance relative to each other and consist of at least one wire turn, said reference element coils all facing in substantially the same direction;

a current generator for exciting the sensor element coils or the reference element coils by means of a presettable excitation alternating current;

a processing circuit for voltages induced in the reference element coils in response to the current generator exciting the sensor element coils or in the sensor element coils in response to the current generator exciting the reference element coils, which processing circuit comprises an arithmetic circuit that calculates, on the basis of the induced voltages, distance coordinates $x_m$, $y_m$, and $z_m$ of the center of the sensor element coils in a coordinate system associated with the reference element; and a feedback circuit which controls the excitation currents in dependence on the amplitude of the induced voltages.

19. A device as claimed in claim 18, wherein the reference element coils are placed in said boundary plane so as to be co-planar.

* * * * *